United States Patent
Shastri et al.

(10) Patent No.: US 8,803,269 B2
(45) Date of Patent: Aug. 12, 2014

(54) WAFER SCALE PACKAGING PLATFORM FOR TRANSCEIVERS

(75) Inventors: Kalpendu Shastri, Orefield, PA (US); Vipulkumar Patel, Breinigsville, PA (US); Mark Webster, Bethlehem, PA (US); Prakash Gothoskar, Allentown, PA (US); Ravinder Kachru, Los Altos Hills, CA (US); Soham Pathak, Allentown, PA (US); Rao V. Yelamarty, Allentown, PA (US); Thomas Daugherty, Allentown, PA (US); Bipin Dama, Bridgewater, NJ (US); Kaushik Patel, San Jose, CA (US); Kishor Desai, Fremont, CA (US)

(73) Assignee: Cisco Technology, Inc., San Jose, CA (US)

(*) Notice: Subject to any disclaimer, the term of this patent is extended or adjusted under 35 U.S.C. 154(b) by 0 days.

(21) Appl. No.: 13/463,408

(22) Filed: May 3, 2012

(65) Prior Publication Data

US 2012/0280344 A1     Nov. 8, 2012

Related U.S. Application Data

(60) Provisional application No. 61/482,705, filed on May 5, 2011, provisional application No. 61/509,290, filed on Jul. 19, 2011, provisional application No. 61/526,821, filed on Aug. 24, 2011, provisional application No. 61/543,240, filed on Oct. 4, 2011, provisional application No. 61/560,378, filed on Nov. 16, 2011.

(51) Int. Cl.
*H01L 31/0232*     (2014.01)
*H01L 29/40*     (2006.01)
*H01L 23/053*     (2006.01)
*H01L 23/12*     (2006.01)

(52) U.S. Cl.
USPC .... 257/432; 257/621; 257/700; 257/E21.597; 257/E23.011; 257/E23.145; 257/E23.174

(58) Field of Classification Search
USPC .......... 257/432, 621, 700, E21.597, E23.011, 257/E23.145, E23.174
See application file for complete search history.

(56) References Cited

U.S. PATENT DOCUMENTS

| | | | |
|---|---|---|---|
| 4,811,082 A * | 3/1989 | Jacobs et al. | 257/700 |
| 5,949,246 A * | 9/1999 | Frankeny et al. | 324/750.05 |
| 6,201,704 B1 | 3/2001 | Poplawski et al. | |
| 6,220,878 B1 | 4/2001 | Poplawski et al. | |
| 6,639,313 B1 | 10/2003 | Martin et al. | |
| 6,794,273 B2 * | 9/2004 | Saito et al. | 438/462 |
| 6,856,014 B1 | 2/2005 | Ehmke et al. | |

(Continued)

*Primary Examiner* — Ida M Soward
(74) *Attorney, Agent, or Firm* — Patterson & Sheridan, LLP (57) ABSTRACT

A wafer scale implementation of an opto-electronic transceiver assembly process utilizes a silicon wafer as an optical reference plane and platform upon which all necessary optical and electronic components are simultaneously assembled for a plurality of separate transceiver modules. In particular, a silicon wafer is utilized as a "platform" (interposer) upon which all of the components for a multiple number of transceiver modules are mounted or integrated, with the top surface of the silicon interposer used as a reference plane for defining the optical signal path between separate optical components. Indeed, by using a single silicon wafer as the platform for a large number of separate transceiver modules, one is able to use a wafer scale assembly process, as well as optical alignment and testing of these modules.

18 Claims, 10 Drawing Sheets

(56) References Cited

U.S. PATENT DOCUMENTS

| | | |
|---|---|---|
| 7,249,896 B2 | 7/2007 | Chen et al. |
| 7,265,330 B2 * | 9/2007 | Farnworth et al. ......... 250/208.1 |
| 7,266,262 B2 * | 9/2007 | Ogawa ........................... 385/14 |
| 7,605,404 B2 * | 10/2009 | Jung et al. ....................... 257/98 |
| 7,736,949 B2 * | 6/2010 | Chen et al. .................... 438/106 |
| 7,741,150 B2 * | 6/2010 | Leow et al. ................... 438/107 |
| 7,978,940 B2 | 7/2011 | Steijer et al. |
| 8,076,782 B2 * | 12/2011 | Asai et al. ..................... 257/774 |
| 8,183,468 B2 * | 5/2012 | Kim et al. ..................... 174/262 |
| 8,253,230 B2 * | 8/2012 | Janzen et al. ................. 257/686 |
| 8,344,512 B2 * | 1/2013 | Knickerbocker ............. 257/773 |
| 8,350,377 B2 * | 1/2013 | Yang ............................. 257/692 |
| 8,379,400 B2 * | 2/2013 | Sunohara ...................... 361/760 |
| 8,427,833 B2 * | 4/2013 | Barowski et al. ............. 361/704 |
| 8,446,020 B2 * | 5/2013 | Koide et al. .................. 257/786 |
| 2002/0180027 A1 * | 12/2002 | Yamaguchi et al. .......... 257/700 |
| 2002/0196996 A1 | 12/2002 | Ray et al. |
| 2004/0036135 A1 | 2/2004 | Yang et al. |
| 2005/0136634 A1 * | 6/2005 | Savastiouk et al. .......... 438/597 |
| 2006/0044433 A1 * | 3/2006 | Akram ........................... 348/294 |
| 2006/0258120 A1 | 11/2006 | Gilroy et al. |
| 2007/0080458 A1 * | 4/2007 | Ogawa et al. ................. 257/750 |
| 2008/0050901 A1 * | 2/2008 | Kweon et al. ................. 438/597 |
| 2009/0022500 A1 | 1/2009 | Pinguet et al. |
| 2009/0050774 A1 | 2/2009 | Poutous et al. |
| 2009/0230087 A1 * | 9/2009 | Akram ............................. 216/26 |
| 2009/0230541 A1 * | 9/2009 | Araki et al. ................... 257/693 |
| 2010/0052107 A1 * | 3/2010 | Bauer ............................ 257/621 |
| 2010/0219525 A1 * | 9/2010 | Ibaraki .......................... 257/693 |
| 2010/0308443 A1 * | 12/2010 | Suthiwongsunthorn et al. ............................. 257/621 |
| 2011/0215478 A1 * | 9/2011 | Yamamichi et al. .......... 257/773 |
| 2011/0216998 A1 | 9/2011 | Symington et al. |
| 2012/0001166 A1 * | 1/2012 | Doany et al. .................... 257/43 |
| 2012/0146209 A1 * | 6/2012 | Hu et al. ........................ 257/692 |
| 2012/0181568 A1 * | 7/2012 | Hsia et al. ....................... 257/99 |
| 2012/0187462 A1 * | 7/2012 | Law et al. ..................... 257/292 |
| 2012/0267751 A1 * | 10/2012 | Haba et al. .................... 257/499 |
| 2012/0267777 A1 * | 10/2012 | Haba et al. .................... 257/737 |
| 2012/0286240 A1 * | 11/2012 | Yu et al. ......................... 257/13 |
| 2013/0026509 A1 * | 1/2013 | Tohyama et al. ............... 257/88 |
| 2013/0026632 A1 * | 1/2013 | Kikuchi et al. ............... 257/753 |
| 2013/0119555 A1 * | 5/2013 | Sundaram et al. ............ 257/774 |

* cited by examiner

WAFER SCALE PACKAGING PLATFORM FOR TRANSCEIVERS

CROSS-REFERENCE TO RELATED APPLICATIONS

This application claims the benefit of the following U.S. Provisional Applications: Ser. No. 61/482,705, filed May 5, 2011; Ser. No. 61/509,290, filed Jul. 19, 2011; Ser. No. 61/526,821, filed Aug. 24, 2011; Ser. No. 61/543,240, filed Oct. 4, 2011; and Ser. No. 61/560,378, filed Nov. 16, 2011, all of which are incorporated by reference herein.

TECHNICAL FIELD

The present invention relates to a wafer scale implementation of opto-electronic transceivers and, more particularly, to the utilization of a silicon wafer as an optical reference plane and platform upon which all necessary optical and electronic components are assembled for a multiple number of transceivers in a wafer scale process.

BACKGROUND OF THE INVENTION

In optical communication networks, transceivers are used to transmit and receive optical signals over optical fibers or other types of optical waveguides. On the transmit side of the transceiver, a laser diode and associated circuitry is used to generate a modulated optical signal (representing data) that is ultimately coupled into an output signal path (fiber, waveguide, etc.). On the receive side of the transceiver, one or more incoming optical signals are converted from optical signals into electrical signals within a photodiode or similar device. Inasmuch as the electrical signal is very weak, an amplifying device (for example, a transimpedance amplifier) is typically used to boost the signal strength before attempting to recover the data information from the received signal.

Optical transceiver modules thus comprise a number of separate components that require precise placement relative to one another. As the components are being assembled, active optical alignment is required to ensure that the integrity of the optical signal path is maintained. In most cases, these transceiver modules are built as individual units and, as a result, the need to perform active optical alignment on a unit-by-unit basis becomes expensive and time-consuming.

As the demand for optical transceiver modules continues to increase, the individual unit assembly approach becomes problematic and, therefore, a need remains for a different approach to optical transceiver assembly that can improve the efficiency of the construction process while preserving the integrity of module, including the required precise optical alignment between elements.

SUMMARY OF THE INVENTION

The need remaining in the art is addressed by the present invention, which relates to a wafer scale implementation of an opto-electronic transceiver assembly process and, more particularly, to the utilization of a silicon wafer as an optical reference plane and platform upon which all necessary optical and electronic components are simultaneously assembled for a plurality of separate transceiver modules.

In accordance with the present invention, a silicon wafer is utilized as a "platform" (also referred to hereinafter as an interposer) upon which all of the components for a multiple number of transceiver modules are mounted or integrated, with the top surface of the silicon interposer used as a reference plane for defining the optical signal path between separate optical components. Indeed, a single silicon wafer is used as the platform for a large number of separate transceiver modules, providing the ability to use a wafer scale assembly process, as well as optical alignment and testing of these modules, addressing the concerns of the prior art as mentioned above.

In further accordance with the present invention, the utilization of a silicon interposer allows for various through-silicon vias to be formed and used to provide electrical connections between components placed on the interposer and underlying electrical components. Electronic integrated circuits such as laser drivers, micro-controllers and transimpedance amplifiers are accurately placed on the silicon interposer using photolithographically-aided features formed on the interposer. Wafer scale wirebonding techniques are used to create the necessary electrical connections between the individual elements. Optical components such as lasers, isolators, lenses (individual and arrays), photodiodes and the like are placed within lithographically-defined openings on the interposer, where the ability accurately and precisely define the location and size of openings using conventional CMOS fabrication techniques allows for passive optical alignment processes to be used where appropriate.

It is an aspect of the present invention that the wafer scale assembly of multiple transceiver modules allows for a wafer scale active alignment scheme to be used when necessary, based on an electro-optic probe containing a precisely placed detector and/or optical source, turning mirrors and other optics, as well as electrical probes. By virtue of the wafer scale assembly of the transceiver modules, the placement of components and subsequent alignment and testing can be performed in a conventional "step and repeat" fashion.

In one embodiment of the present invention, a second wafer is used as a "lid" for the assembled modules, with the lid wafer first being etched and processed to define separate cavities within which the individual transceiver modules will be located. The lid may be formed of glass, silicon or any other suitable material. A wafer-to-wafer bonding of the arrangement results in creating the final wafer scale transceiver assembly, which can then be diced to create the separate, individual transceiver modules.

In an alternative embodiment, a metal lid may be used in situations (high bandwidth, high frequency, for example) that have more stringent requirements with respect to EMI shielding.

A particular embodiment of the present invention comprises a wafer scale arrangement of optical transceiver modules including a silicon interposer wafer for use as a platform for assembling a plurality of separate transceiver modules, the silicon interposer wafer defined as comprising a planar top surface defining an optical reference plane, a plurality of conductive vias formed therethrough to provide electrical connections to other components and optical waveguiding regions formed along the surface thereof and a dielectric layer formed over the planar top surface of the silicon interposer wafer, the dielectric layer for supporting the placement and interconnection of electrical integrated circuit components associated with a plurality of separate transceiver modules, the dielectric layer configured to include a plurality of openings formed therethrough so as to expose the planar top surface of the silicon interposer wafer in each opening, the plurality of openings of predetermined size and disposed in predetermined locations for properly positioning and aligning optical components of each transceiver module, the dielectric layer further including electrical conductive paths for providing electrical connection between the supported electrical integrated circuit components and selected ones of the conductive vias of the underlying silicon wafer.

Other and further aspects and advantages of the present invention will become apparent during the course of the following discussion and by reference to the accompanying drawings.

BRIEF DESCRIPTION OF THE DRAWINGS

Referring now to the drawings, where like numerals represent like elements in several views.

DETAILED DESCRIPTION

In the following description, for purposes of explanation and not limitation, specific details are set forth in order to provide a thorough understanding of the present invention. However, it will be apparent to one skilled in the art that the present invention may be practiced in other embodiments that depart from these specific details. In other instances, detailed descriptions of well-known devices and methods are omitted so as not to obscure the description of the present invention with unnecessary details.

As mentioned above, a significant improvement in fabrication efficiency, without sacrificing the integrity of the necessary precise optical alignments between various individual elements, is provided in accordance with the present invention by utilizing a wafer scale assembly technique, employing a silicon wafer as a carrier substrate (also referred to hereinafter as an interposer) upon which the individual components (including electronic integrated circuits, active optical devices and passive optical devices) are mounted, aligned, bonded, etc. Since a typical silicon wafer (for example, an 8" wafer) can support the creation of multiple transceiver modules (e.g., tens of die across the wafer surface), the wafer-scale fabrication and assembly techniques of the present invention are capable of improving the efficiencies of transceiver module assembly and packaging processes.

Figure 1:
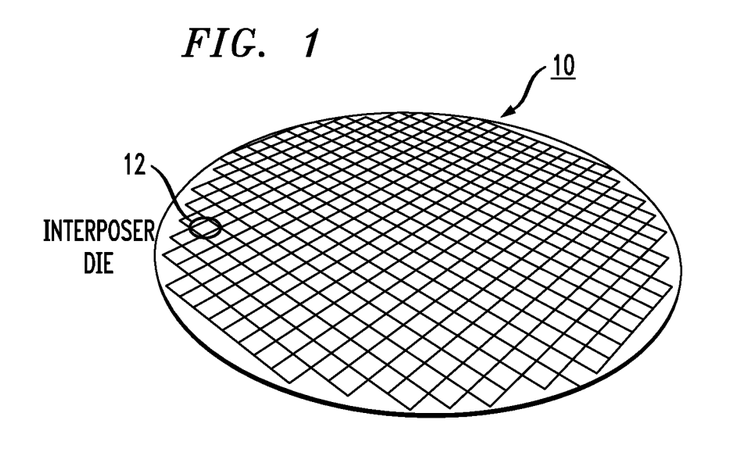
FIG. 1 illustrates an exemplary silicon wafer that may be used to form a silicon interposer for wafer scale assembly of multiple transceiver modules in accordance with the present invention.
Figure 2:
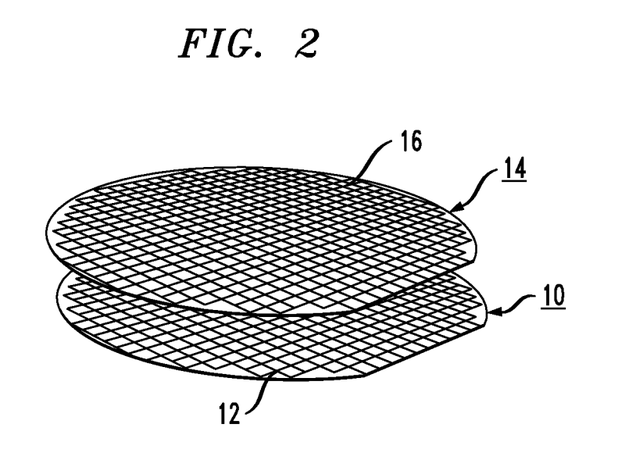
FIG. 2 illustrates an exemplary arrangement of a combination of a transceiver module-populated silicon interposer wafer with a "lid" wafer, where the lid is ultimately bonded to the interposer wafer to form a packaging of multiple transceiver modules.

Prior to describing the details associated with using a silicon wafer as an interposer or platform, the following discussion, with reference to FIGS. 1 and 2, will provide an overall understanding of the benefits of using a wafer scale process to assemble the transceivers in the first instance.

FIG. 1 illustrates an exemplary silicon wafer 10 that may be utilized as an interposer wafer in accordance with the present invention. As shown, a large number of individual interposer die 12 are defined on wafer 10 as being locations where individual transceiver modules are to be assembled. Once wafer 10 is fully populated with the multiple transceiver modules, a separate lid wafer 14, as shown in FIG. 2, is bonded to interposer wafer 10 in a manner that results in encapsulating each individual transceiver module. In particular, lid wafer 14 is formed to include separate chambers 16 that will form the coverings for the separate transceiver modules (as described in detail below). Once the wafers are joined, the bonded structure is diced to form the final, individual transceiver modules. A laser dicing process is preferred, but it is to be understood that any other suitable process for separating the bonded wafers into separate transceiver modules may also be used.

With this understanding of the overall wafer-based approach to creating transceiver modules, the following discussion will focus on the aspects associated with utilizing a silicon interposer platform in the assembly of exemplary transceiver embodiments. It is to be understood that in drawings where only a single transceiver arrangement shown, the actual assembly process creates multiple transceiver modules across the surface of the interposer wafer, at each separate die location (or at least at a subset of the die locations, as need be, based upon need, wafer quality and the like), as shown in FIG. 1.

Figure 3:
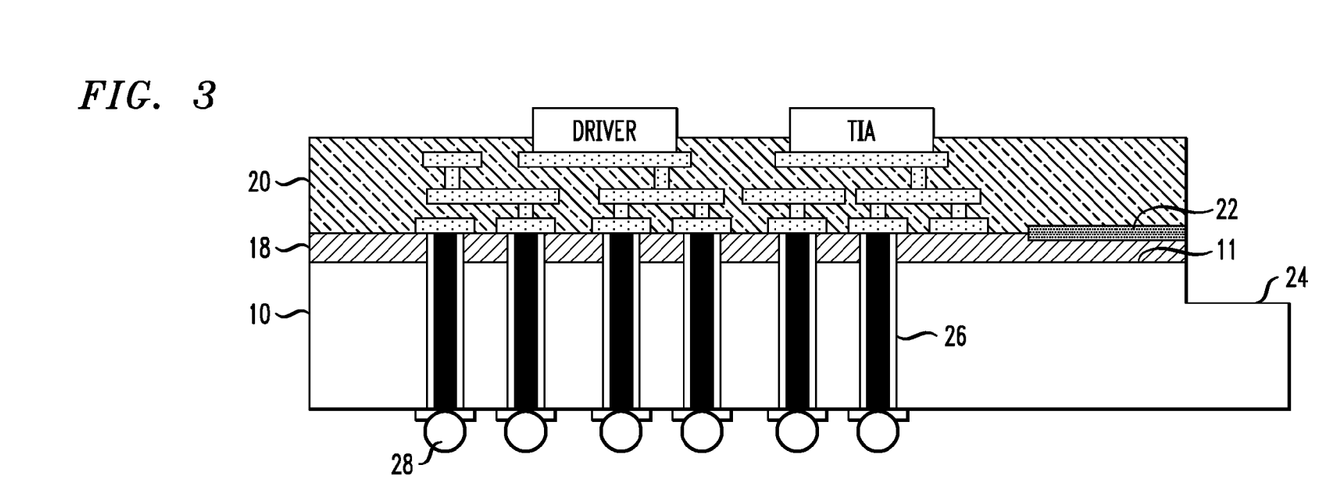
FIG. 3 is a cross-sectional view of an exemplary interposer die including plurality of components formed in accordance with the present invention.

FIG. 3 is a cut-away side view of a portion of an interposer wafer 10, as processed to be populated with a number of components forming an exemplary transceiver module. In this case, a buried oxide (BOX) layer 18 is formed over top surface 11 of interposer wafer 10, with a relatively thick interlevel dielectric (ILD) layer 20 formed over BOX layer 18. A relatively thin silicon layer 22 is created at the interface between BOX layer 18 and ILD layer 20, where silicon layer 22 is used as an optical waveguiding layer. Indeed, it is seen that the combination of interposer wafer 10, BOX layer 18 and silicon layer 22 forms a well-known silicon-on-insulator (SOI) optical structure that has been extensively used in recent years in the creation of passive and active optical components.

As will be discussed hereinbelow, optical waveguiding layer 22 is specifically defined and is routed along this interface to provide the desired optical communication path(s) between the various components forming a transceiver module. In accordance with the present invention, the planarity of top surface 11 of interposer wafer 10 is precisely controlled so that surface 11 functions as an optical reference plane for the transceiver module. As a result, and discussed in detail below, the creation of an optical reference plane allows for passive techniques to be used to provide alignment between various optical components as they process propagating optical signals. In an alternative embodiment, one or more optical components can first be assembled and precisely aligned on a separate submount element, as discussed below in associated with FIG. 11, with the submount then precisely placed on surface 11 of interposer 10, avoiding the need to perform multiple wafer scale active alignments. Also shown in the view of FIG. 3 is a lithographically-defined feature 24, which may be used for providing optical I/O connections to interposer wafer 10.

Another advantage of utilizing interposer wafer 10 in the fabrication of transceiver modules is that the necessary connections between the electronic integrated circuit components forming the transceiver module (e.g., laser driver, transimpedance amplifier, etc.) and underlying sources of power, signal, etc., can be created by using conventional vias 26 formed through the thickness of interposer 10, as shown in FIG. 3. Either metal or doped silicon material can be used to "fill" vias 26 and form the conductive path between the transceiver module and the power and signal contacts. In the specific embodiment shown in FIG. 3, a plurality of solder bumps 28 is formed at the termination of vias 26 and used for connection to an associated arrangement of bond pads on a printed circuit board, or other source of power and data signals (not shown).

Figure 4:
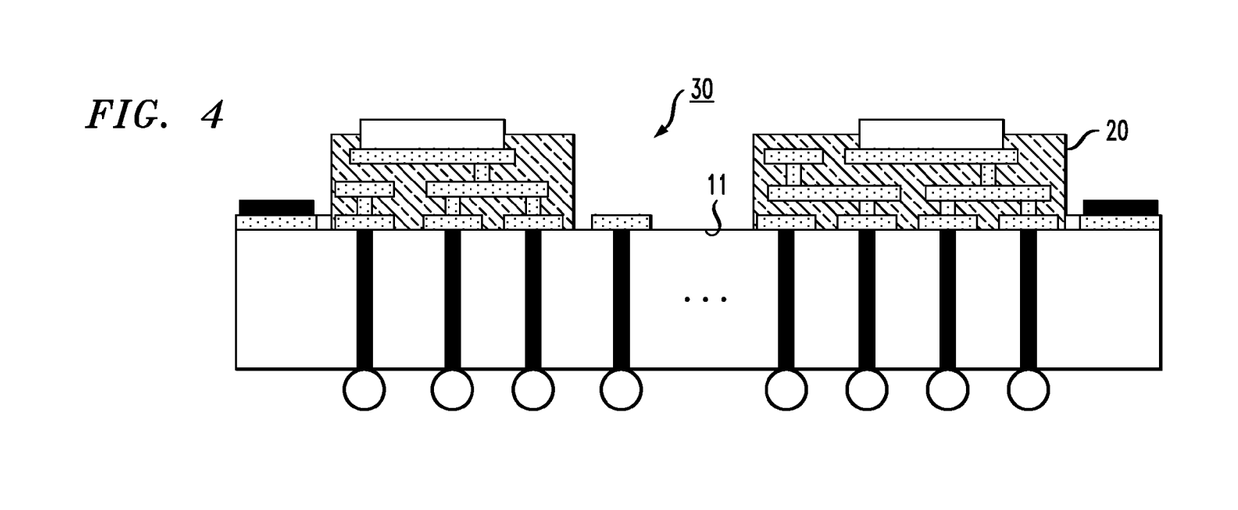
FIG. 4 is a cross-sectional view of an alternative interposer die structure formed in accordance with the present invention, this structure including an opening to the silicon interposer surface to form an optical reference plane.

FIG. 4 is a side view of another embodiment of interposer wafer 10 and included components forming an optical transceiver module. This particular embodiment does not specifically show BOX layer 18, but it is to be understood that such a layer may still be included in such a transceiver arrangement. Specifically shown in this view is the processing of ILD layer 20 to form a plurality of openings 30. As discussed above, these openings 30 are created to expose top surface 11 of silicon interposer wafer 10, allowing surface 11 to function as a well-defined optical reference plane. Advantageously, it is possible to use standard photolithographic patterning and etching techniques to form openings 30 with precise geometries and in precise locations relative to other components forming the transceiver so as to provide for passive optical alignments, where possible, between various components. Indeed, a selective etchant (such as HF, for example) will naturally stop at surface 11 of silicon interposer 10 as predefined regions of ILD layer 20 are removed. Therefore, there is no concern about either over-etching or under-etching and degrading the planarity of surface 11 during the etching process.

Figure 5:
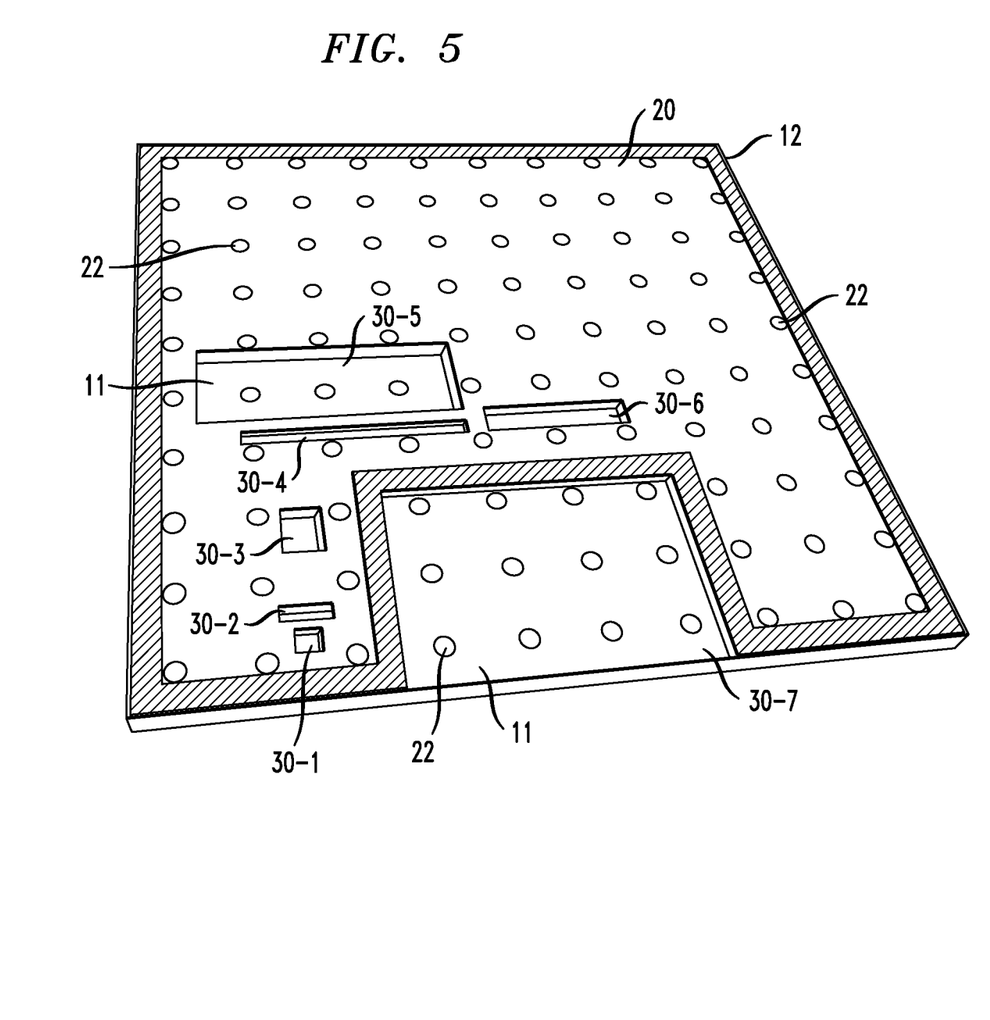
FIG. 5 is an isometric view of an exemplary interposer die showing a plurality of openings for supporting the various optical components forming the transceiver arrangement of the present invention.

FIG. 5 is an isometric top view of an exemplary interposer die 12 particularly illustrating the creation of a plurality of openings 30 for supporting the various optical components in the predefined, precise locations by virtue of using exposed surface 11 of interposer 10 as a reference plane. While FIG. 5 shows only a single interposer die, it is to be understood that the process of forming these openings, followed by the placement of the various components, is performed as a wafer scale process, where each interposer die 12 of wafer 10 is simultaneously populated with the individual optical and electrical components. In the particular embodiment of FIG. 5, a plurality of openings 30 are formed to allow for the precise placement of a number of critical optical components. As described above, openings 30 are created to expose top surface 11 of silicon interposer 10, where surface 11 is precisely defined and controlled to create and maintain a planar optical reference. For example, a first opening 30-1 is used as the location for a laser diode and a second opening 30-2 is used to support a lens element.

Through the careful control of the location of openings 30-1 and 30-2 (possible using conventional photolithographic patterning and etching techniques), once the laser diode and lens are inserted in their respective openings, they will be aligned, since each component will be resting on optical reference plane top surface 11. Similarly, a third opening 30-3 is used to support an optical isolator, which will then also be in the optical signal path and in alignment with the laser diode and lens. In some cases, active alignment is required to properly align the laser diode with its associated lens. In that event, a wafer scale active alignment scheme is used, based, for example, on an electro-optic probe comprising a precisely placed detector and/or optical source, turning mirrors and other optics (and, perhaps, electrical probes) to provide alignment and testing of components in a conventional "step and repeat" fashion across the wafer surface. Similarly, wafer scale electrical burn-in of various components (such as, for example, a laser diode) is accomplished using an electrical probe card in the same step and repeat process.

Continuing with the description of FIG. 5, an opening 30-4 is created through ILD layer 20 to support a lens element, with a large opening 30-5 positioned behind opening 30-4. Large opening 30-5 is used to support a product-specific CMOS photonic integrated circuit used to perform various types of signal processing (e.g., modulating a CW laser signal with an electrical data signal to create a data-modulated optical output signal). The particular operation of the photonic integrated circuit is not germane to the subject matter of the present invention. An opening 30-6 is used to support a coupling element associated with an output optical signal, with opening 30-7 utilized to support an associated optical I/O connection (see, for example, feature 24 as shown in FIG. 3). A number of vias 26 are also shown in FIG. 5, where in this particular embodiment the vias are disposed in a regular grid pattern across the surface of the complete silicon interposer wafer 10 so that they may be used as needed in different transceiver configurations.

Figure 6:
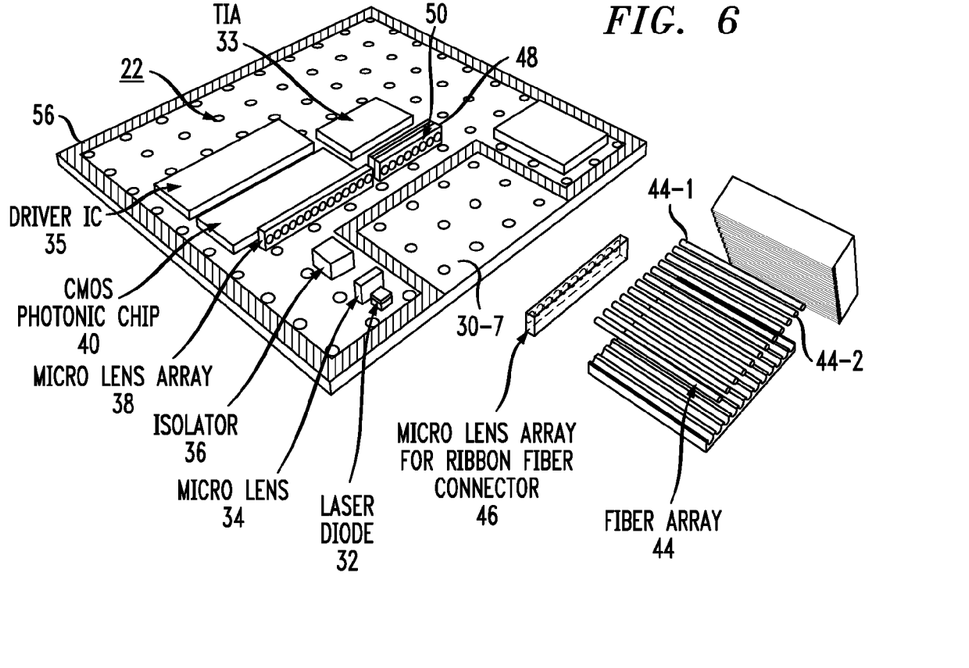
FIG. 6 is a view of the arrangement of FIG. 5, in this case with the optical and electrical components disposed on the surface of the interposer die.

FIG. 6 is a view of the arrangement of FIG. 5, in this case with the various optical components disposed within their associated openings. As shown, a laser diode 32 is positioned within opening 30-1 and a microlens 34 is disposed within opening 30-2. An isolator 36 is placed within opening 30-3, in the optical output signal path from laser diode 32. The output from isolator 36 is then passed through a microlens array 38 disposed within opening 30-4, where the lens array is used to couple the propagating optical signal into a CMOS photonic integrated circuit 40. Various well-known methods may be used for affixing the optical components in place in their respective openings. In particular, epoxy, eutectic bonding or other arrangements may be used to permanently attach the optical components in their respective openings. It is to be understood that an appropriate temperature hierarchy needs to first be established such that the stability of the joints are ensured during other potentially high temperature post-processing operations.

In the specific embodiment shown in FIG. 6, a fiber array connector 42 is disposed within opening 30-7, with the individual fibers 44 forming the array used to introduce optical signals to, and output optical signals from, the transceiver module. It is to be noted that opening 30-7 may, in some cases, comprise feature 24 that is lithographically formed in manner described above. In this embodiment, a lens array 46 is included within fiber array connector 42 at the termination of the plurality of individual fibers 44. In operation, incoming optical signals along, for example, optical fibers 44-1 and 44-2 will pass through lens array 46, and then impinge a lens element 48 and photodiode 50 disposed within opening 30-6, creating an associated electrical signal representation. Lens element 48 and photodiode 50, as shown in FIG. 6, are disposed in opening 30-6, which is formed to be in alignment with opening 30-7 (and, more particularly, with the location of fibers 44-1 and 44-2 within the array). Various electrical components, such as transimpedance amplifier 33 and a laser driver 35 are also positioned at predetermined locations on interposer die 12. Here, the electrical components are disposed on the surface of ILD layer 20 (see FIG. 4), with necessary electrical connections made using the vias 26 formed through interposer die 12.

Figures 7, 8:
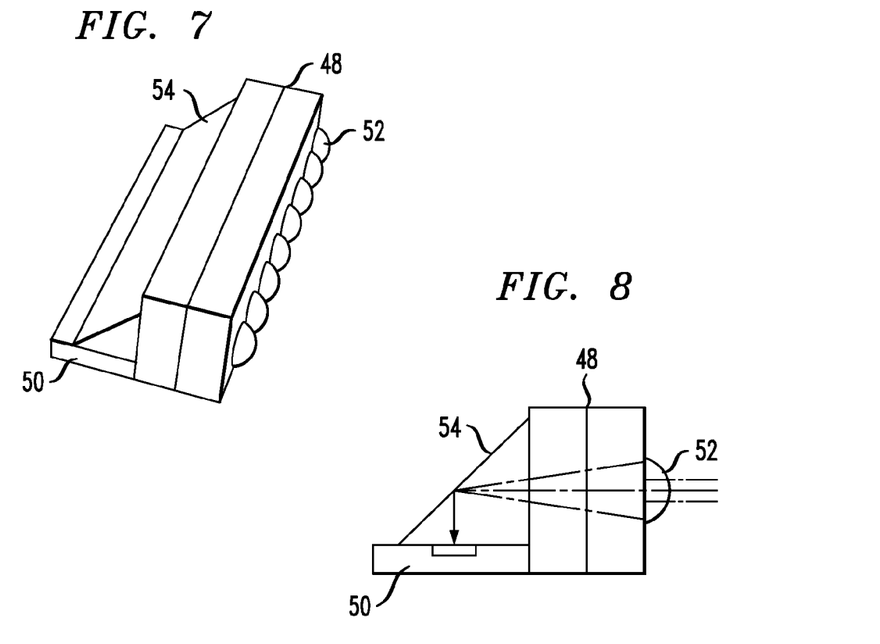
FIG. 7 is a detailed isometric illustration of an exemplary lens and photodiode component that may be used to capture an incoming optical signal and convert it into an electrical representation.
FIG. 8 is a cut-away side view of the arrangement of FIG. 7.

An exemplary combination of lens element 48 and photodiode 50 is shown in FIGS. 7 and 8, where FIG. 7 is an isometric view, and FIG. 8 is a cut-away side view. In this particular embodiment, lens element 48 takes the form of a lens array and includes a plurality of curved surfaces 52 for focusing a plurality of incoming optical signals, as best shown in FIG. 8. A prism component 54 is used as a 90° turning mirror to redirect the plurality of focused optical signals from a horizontal to a vertical plane, with photodiode 50 (in this case a photodiode array) disposed to receive incoming optical signals. It is to be understood that this is merely one exemplary configuration for receiving incoming optical signals and converting them into an electrical representation. Various other arrangements may be utilized within the wafer-based arrangement of transceiver modules in accordance with the present invention.

Referring back to FIG. 6, a sealing layer 56 is shown as being formed around the perimeter of interposer die 12 (again, it is to be understood that this layer is formed around the perimeter of each die 12 forming interposer wafer 10). This sealing layer, which may comprise a glass frit material, a AuSn solder, or any other suitable material, is used to bond a separate lid component to the populated interposer die. In accordance with the present invention, and shown below in FIG. 9, a lid component 58 is formed to match the "footprint" of interposer die 12 and is disposed over die 12 and sealed thereto by the presence of sealing layer 56. Recalling the discussion associated with FIG. 2, it is to be understood that a plurality of separate lid components 58 are formed in a separate wafer and, during fabrication, the entire wafer is bonded (via the multiple sealing layers 56) to interposer wafer 10.

Figure 9:
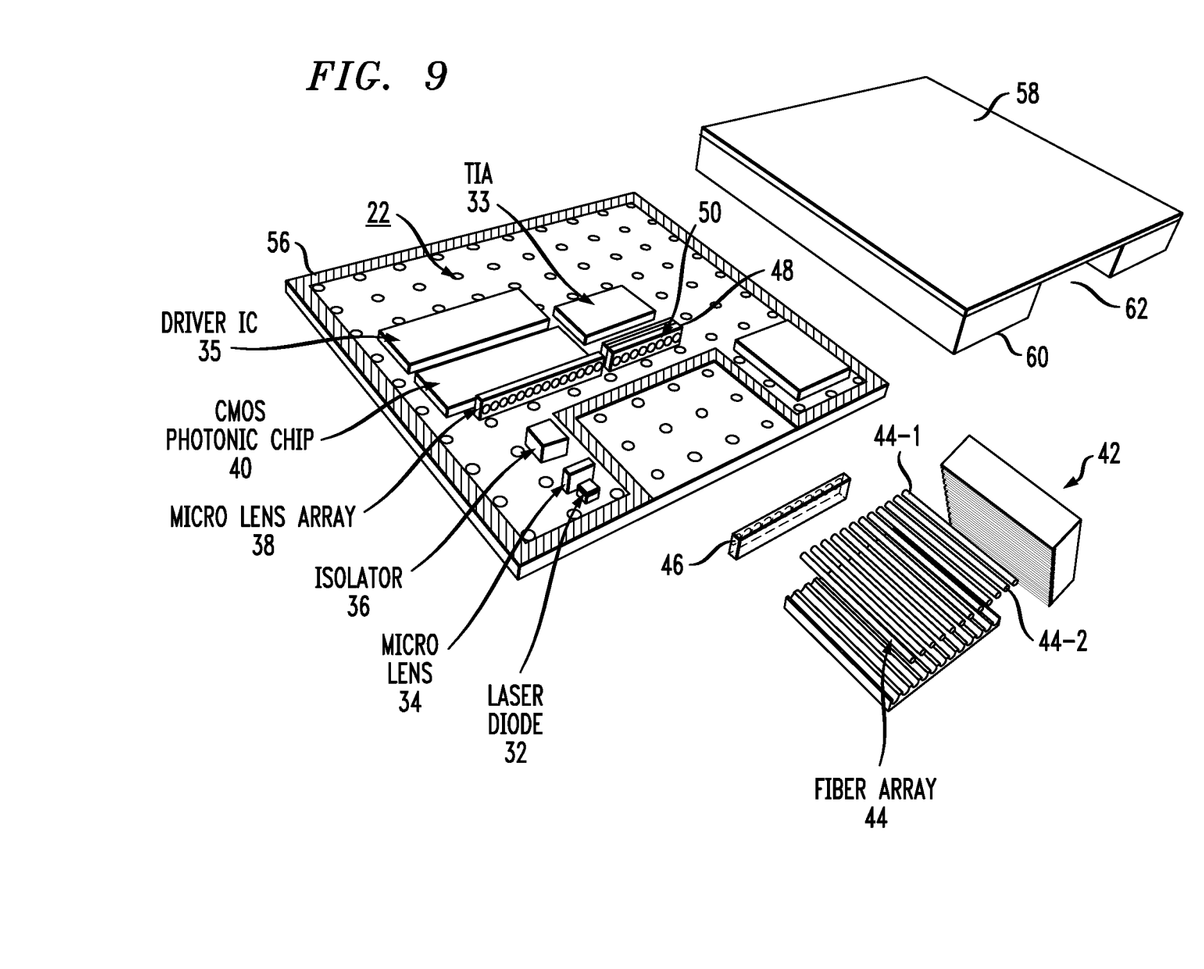
FIG. 9 illustrates the interposer die as shown in FIG. 6, as well as an exemplary lid component that may be bonded to a fully-populated interposer wafer.
Figure 10:
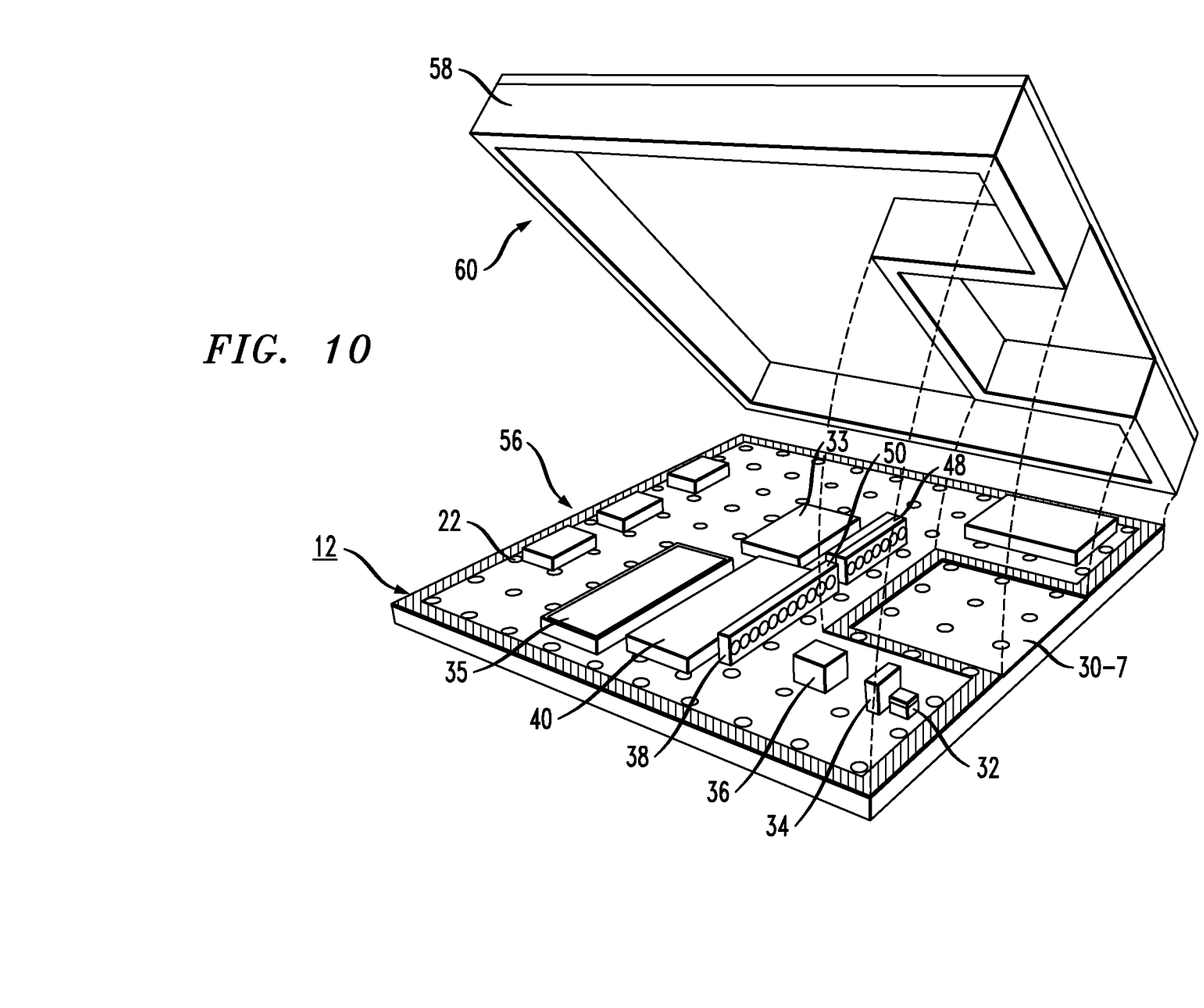
FIG. 10 is an alternative view of the arrangement of FIG. 9, in this case showing the underside of the lid component.

Turning to FIG. 9, it is evident that lid component 58 is specifically formed to follow the periphery of interposer die 12 as guided by the pattern of sealing layer 56. Bottom surface 60 of lid component 58 is coated with a specific material (for example, a metal such as gold) to form a sealing of lid component 58 to interposer die 12. As shown in FIG. 9, sealing layer 56 and lid component 58 are specifically designed to create an opening 62, which allows for the optical input and output signals to access the transceiver module (for example, opening 62 may be used to allow for optical connector 42 to be inserted, as shown in this particular embodiment). FIG. 10 is an alternative isometric view of the arrangement of FIG. 9, showing in particular bottom surface 60 of lid component 58 and illustrating how it follows the same path as sealing layer 56 of interposer die 12.

Figure 11:
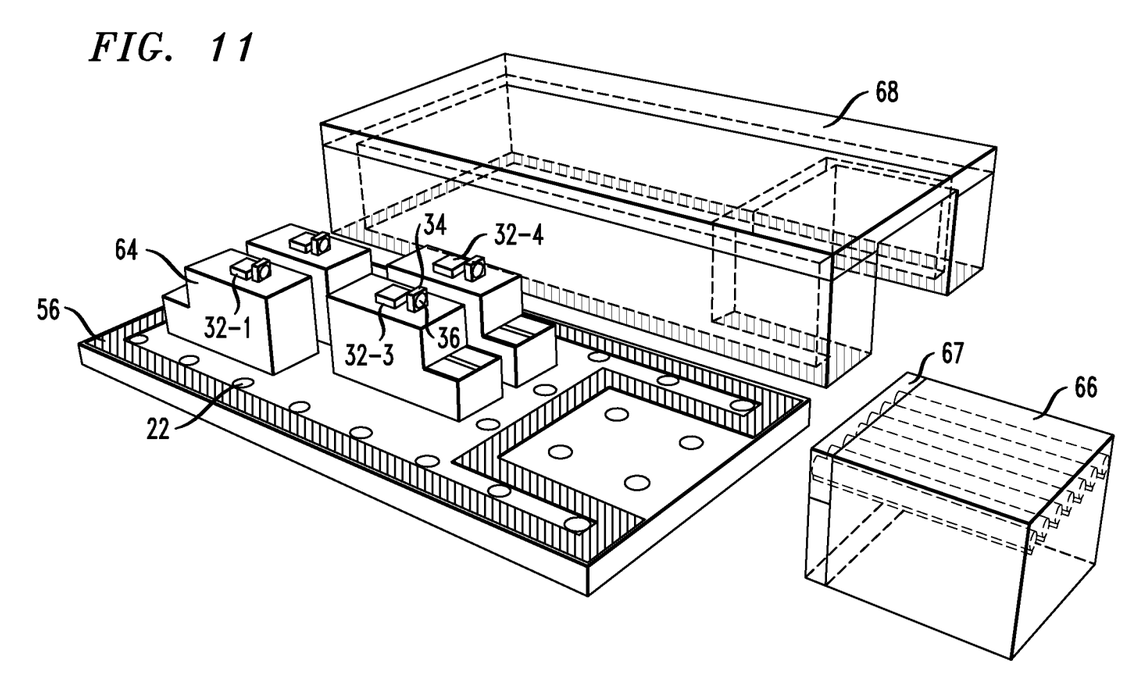
FIG. 11 illustrates an alternative embodiment of the present invention, in this case where a plurality of four separate laser diodes are disposed on submounts, with the submounts then disposed in openings formed in the interposer.

As mentioned above, an advantageous feature of utilizing a silicon wafer interposer for assembling, aligning and testing transceiver modules on a wafer-scale basis is that the silicon interposer may easily be fabricated to accommodate various arrangements of the different components forming the transceiver. Indeed, some arrangements may use multiple laser inputs, external laser inputs, or other various embodiments. FIG. 11 illustrates another embodiment of the present invention where in this case, a set of four separate laser diodes 32-1, 32-2, 32-3 and 32-4 are included within the transceiver. As shown in FIG. 11, each laser diode is positioned with an associated lens 34-$i$ and isolator 36-$i$ on a submount element 64. The use of submounts 64 allows for the optical transmitting subassembly comprising the laser, isolator and lens to be separately mounted and aligned. Thereafter, the set of submounts 64 are disposed in properly-sized openings formed in interposer die 12 (not visible in the view of FIG. 11), where the proper placement of the openings for these submounts results in creating the desired optical alignment with an associated fiber array 66. In an exemplary embodiment, the submount may comprise a thermo-electric cooler (TEC) component. An exemplary lid component 68 is also shown in FIG. 11, where it is to be understood that lid component 68 is formed to have a depth sufficient to accommodate the raised positioning of the laser diodes.

Figure 12:
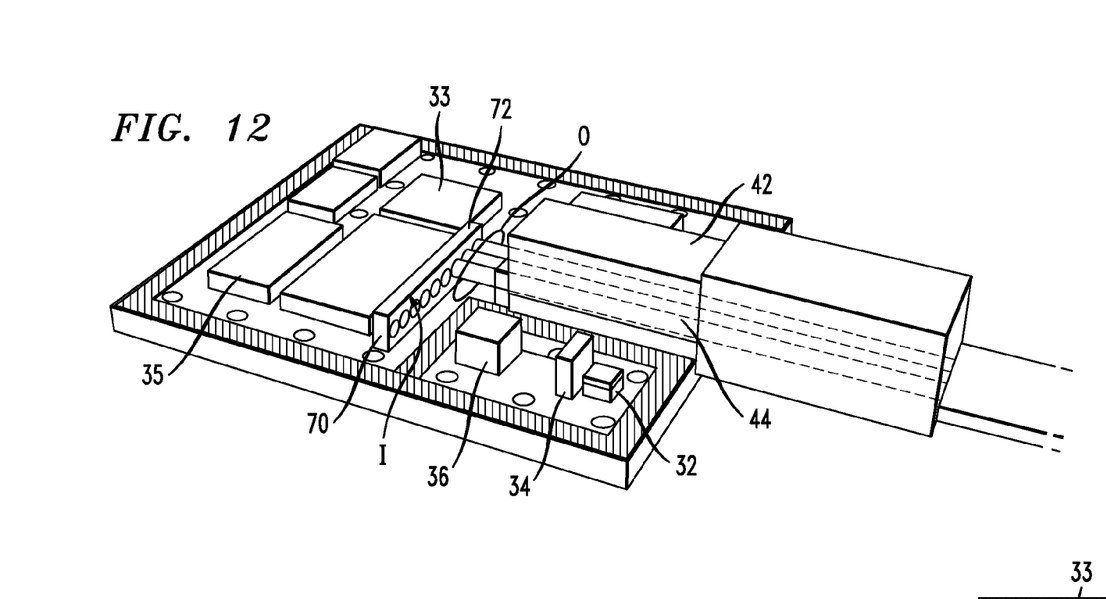
FIG. 12 shows yet another embodiment of the present invention, in this case where a simplified, single lens array is utilized to provide focusing for both the transmitting and receiving portions of the module.
Figure 13:
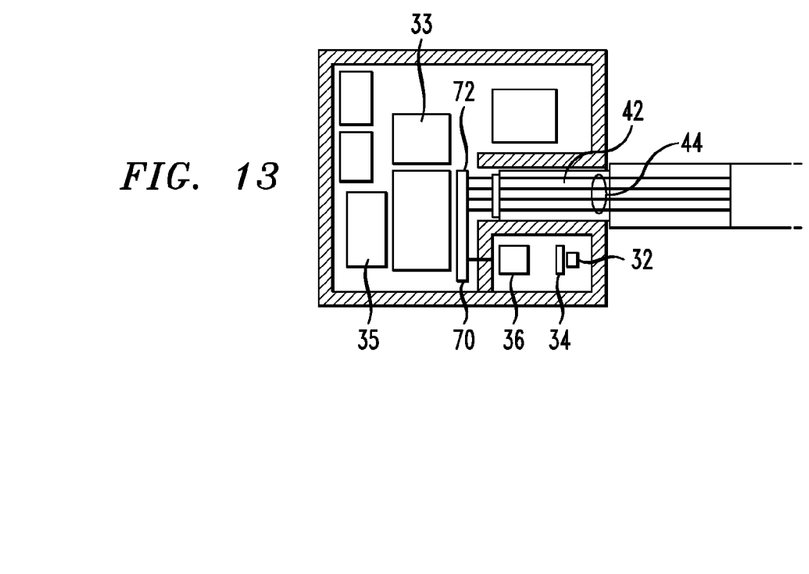
FIG. 13 is a top view of the arrangement of FIG. 12.

FIGS. 12 and 13 illustrate yet another embodiment of the present invention, in this case where interposer die 12 is processed to form a single opening 70 for placement of a lens array 72 that is used in conjunction with both transmit and receive optical signals (compare with openings 30-4 and 30-6 in FIG. 5, as used to support separate lens elements 38 and 48, respectively). Again, it is a particular advantage of the utilization of a silicon wafer interposer as a "platform" for the assembly of optical transceiver modules that the specific arrangement and placement of components can be modified by merely changing the patterning of ILD layer 20 to provide the desired openings (of the proper dimensions) in the locations associated with a particular transceiver module arrangement, while always maintaining the optical reference plane defined by top surface 11 of interposer wafer 10. FIG. 12 is an isometric view of die 12, illustrating the location of opening 70 and lens array 72 with respect to both laser diode 32 and fiber connector 42. Input optical signal I from laser diode 32 is shown as passing through lens array 72 and entering an integrated transceiver circuit arrangement 74. A set of four output signals O is shown in this example as exiting integrated transceiver circuit arrangement 74 and passing through lens array 72 so as to be focused into a set of fibers 44 within fiber connector 42. The location of the input and output optical signals is best seen in the view of FIG. 13.

Figure 14:
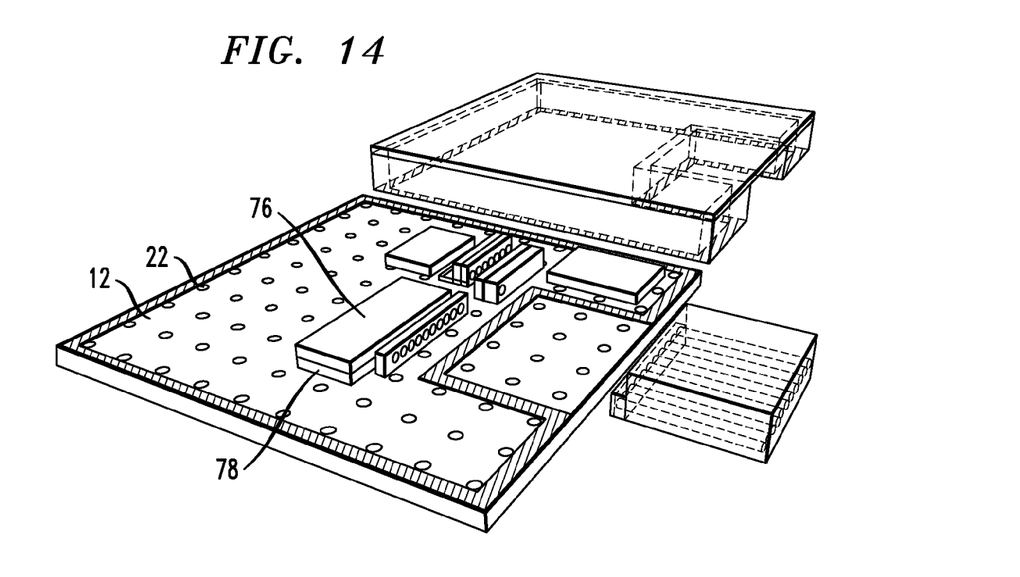
FIG. 14 is another embodiment of the present invention where the integrated circuits are stacked to form a "three-dimensional" configuration.

Another embodiment of the present invention is shown in FIG. 14, which can be thought of as a "three dimensional"

transceiver module, where a first integrated circuit is stacked vertically on a second integrated circuit. As shown, a first integrated circuit 76 is defined as an opto-electronic integrated circuit 76 and is responsive to an incoming optical signal to create a modified optical output signal. A second integrated circuit 78 is defined as an electronic integrated circuit and provides power and electrical data signals to opto-electronic integrated circuit 76. Electronic integrated circuit 78 is, itself, electrically coupled to interposer die 12. As discussed above in association with FIG. 3, interposer die 12 includes a plurality of silicon through vias 26 which enable the transfer of electrical signals from an associated printed circuit board (not shown) generally disposed underneath interposer 10 and the specific components of the transceiver module. Again, the specific locations of the openings formed through ILD layer 18 is dictated by the various components used to form the transceiver module.

Figure 15:
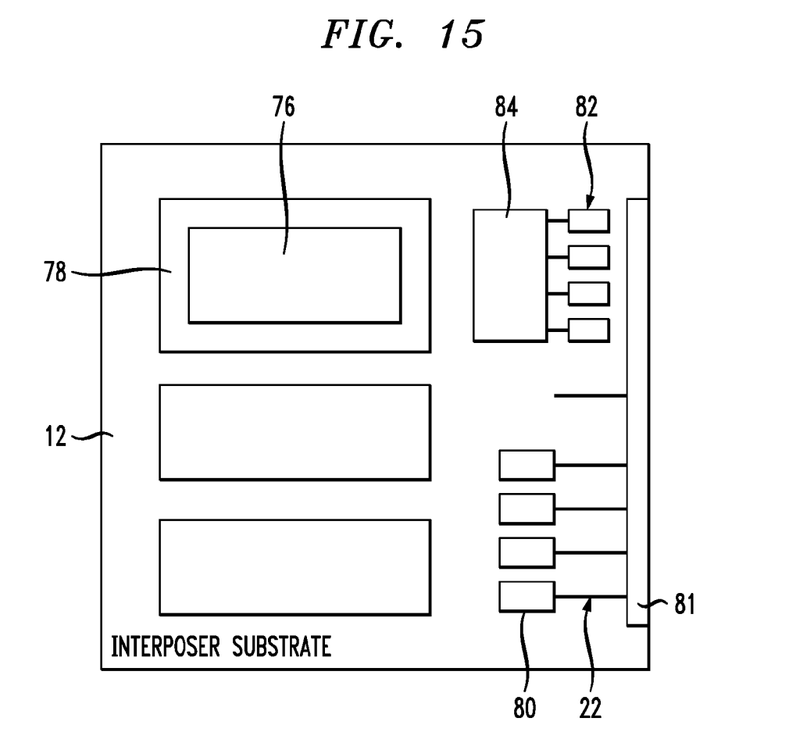
FIG. 15 is a top view of a stacked configuration of the present invention.

It is a particular advantage of using a silicon interposer with the stacked arrangement of FIG. 14 that a multi-level metallization within ILD layer 20 (as shown in FIG. 3) can be used to provide a large number of interconnections to different circuits within a minimal space on the interposer die itself (i.e., a "high density" arrangement). FIG. 15 is a top view of an alternative three-dimensional, stacked transceiver embodiment, where at least some of the associated optical components (in this case, a plurality of optical modulators 80) are formed within the silicon waveguiding layer 22 of interposer 10. Monolithic (or hybrid) inclusion of photodiodes 82 within waveguiding layer 22 is also possible. Indeed, the ability to integrate various silicon-based components of an optical transceiver directly into the waveguiding layer is another advantage of utilizing a silicon interposer layer—processed at a wafer-scale level—in accordance with the present invention. Also shown in this view is a lithographically-defined feature 86 that provides "end fire" coupling of optical signals into waveguiding layer 22. In a preferred embodiment, the end terminations of the waveguiding layers are formed as nanotapers to improve coupling efficiency.

In some applications of systems utilizing transceivers formed in the manner described above, the performance of high speed, high frequency signals is adversely impacted by the presence of electro-magnetic interference (EMI). In the above-described arrangements, an additional ground pad (or ring) was required to be formed on interposer die 12 and then connected to a ground plane.

Figure 16:
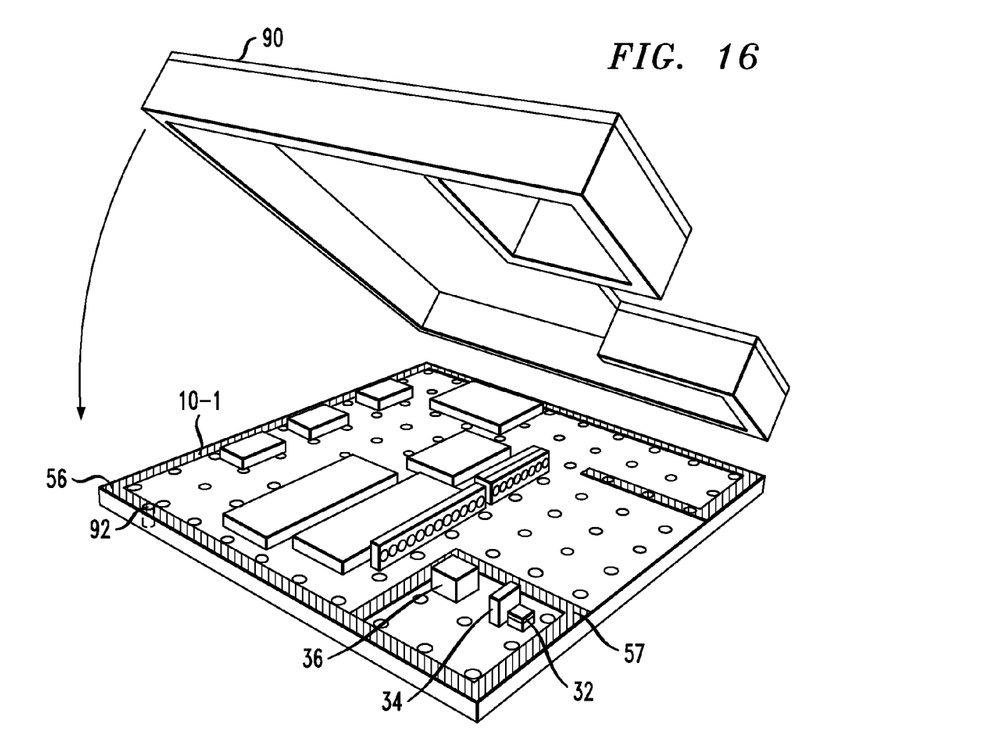
FIG. 16 is an isometric view of another embodiment of the present invention, in this case utilizing a metal lid to provide additional EMI shielding.
Figure 17:
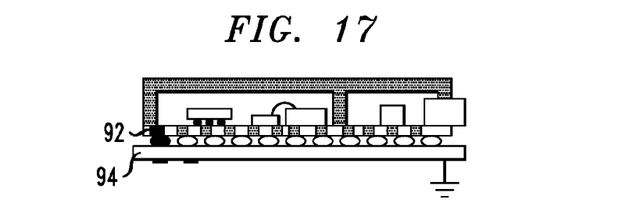
FIG. 17 is a side view of an exemplary embodiment using a metal lid, in this case where the lid is formed to include interior walls to isolate the components form the optical transmitter.
Figure 18:
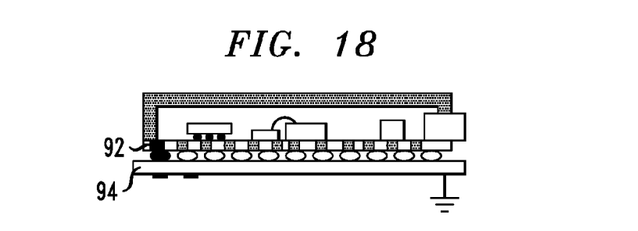
FIG. 18 is a side view of an alternative embodiment of the present invention using a metal lid without any interior walls.

An alternative solution, formed in accordance with the present invention, is shown in FIG. 16, where a metal lid component 90 is utilized in place of the silicon lids as discussed above. Referring to FIG. 16, sealing layer 56 is formed as a metal that will assist in forming a ground connection with metal lid component 90. In this particular embodiment, an additional grounding path 57 is formed to encircle the optical transmitting components 32, 34 and 36, which are most sensitive to EMI. In this embodiment, "grounding" is provided by utilizing a special via 92 within interposer die 12 that is positioned to contact a portion of metal lid 90 and provide an electrical connection to a ground plane (not shown) located under interposer die 12. FIG. 17 is a simplified side view of this arrangement showing the interconnection of metal lid 90 and a ground plane 94 through via 92 of interposer die 12. A side view of an alternative embodiment using a metal lid 90 is shown in FIG. 18, where this embodiment does not include a separate shielding configuration around the optical transmitting components.

It is to be understood that the embodiments of the present invention as described above are intended to be exemplary only. The scope of the present invention is therefore intended to be limited only by the scope of the claims appended hereto.

What is claimed is:

1. A wafer scale arrangement of optical transceiver modules, comprising:
    a silicon interposer wafer for use as a platform for assembling a plurality of separate transceiver modules, the silicon interposer wafer comprising:
        a planar surface defining an optical reference plane,
        a plurality of conductive vias formed therethrough to provide electrical connections to other components, and
        optical wave guiding regions formed along the planar surface; and
    a dielectric layer formed over the planar surface of the silicon interposer wafer,
        the dielectric layer for supporting the placement and interconnection of electrical integrated circuit components associated with the plurality of separate transceiver modules,
        the dielectric layer forming a plurality of openings, thereby exposing the planar surface of the silicon interposer wafer at each opening, the plurality of openings of predetermined size and disposed in predetermined locations for properly positioning and aligning optical components of each transceiver module to permit optical signal paths between the aligned optical components along the optical reference plane,
        the dielectric layer further including electrical conductive paths for providing electrical connection between the supported electrical integrated circuit components and selected ones of the conductive vias of the underlying silicon interposer wafer.

2. The wafer scale arrangement of claim 1, wherein the plurality of openings formed through the dielectric layer are created by patterning and etching the dielectric layer in predetermined areas associated with the placement of optical components for each transceiver module of the plurality of transceiver modules formed in the wafer scale arrangement.

3. The wafer scale arrangement of claim 2, wherein a preferential etchant is used to create the openings such that the etching process stops upon exposure of the underlying silicon interposer wafer.

4. The wafer scale arrangement of claim 1, wherein the arrangement further comprises:
    a lid component disposed over and attached to the combination of the silicon interposer wafer and dielectric layer, the lid component being configured to include separate chambers associated with the plurality of transceiver modules such that each transceiver module is separately encapsulated.

5. The wafer scale arrangement of claim 4, wherein the lid component is bonded to the combination of the silicon interposer wafer and the dielectric layer.

6. The wafer scale arrangement of claim 4, wherein each transceiver module as formed includes a sealing layer defining the outline thereof, the sealing layer used to attach an associated portion of the lid component.

7. The wafer scale arrangement of claim 6, wherein a bottom surface of the lid component is covered with a material that creates a permanent attachment to the sealing layer when the lid component is affixed to the combination of the silicon interposer wafer and dielectric layer.

8. The wafer scale arrangement of claim 4, wherein the lid component comprises a silicon wafer.

9. The wafer scale arrangement of claim 4, wherein the lid component comprises a glass wafer.

10. The wafer scale arrangement of claim 4, wherein the lid component comprises a metal component.

11. The wafer scale arrangement of claim 10, wherein the arrangement further comprises a grounding via formed through the dielectric layer and the silicon interposer wafer for coupling the metal lid component to an associated ground plane.

12. The wafer scale arrangement of claim 11, wherein the metal lid component is configured to include an internal compartment within each chamber, the internal compartment for separately encapsulating the optical portion of each transceiver module, providing protection from electromagnetic interference.

13. The wafer scale arrangement of claim 1, wherein a set of openings formed through the dielectric layer are associated with creating an optical input/output connection to each separate transceiver module.

14. The wafer scale arrangement of claim 13, wherein the set of openings are disposed at an end region of each transceiver location such that an optical connector is capable of accessing the optical components and is aligned with the optical plane reference surface of the silicon interposer wafer.

15. The wafer scale arrangement of claim 1, wherein each transceiver module includes optical transmitting components including a laser diode, a lens element and an optical isolator, and the dielectric layer is formed to include openings for the laser diode, lens element and optical isolator in each region associated with a separate transceiver module, wherein a set of openings for a laser diode, lens element and optical isolator in each region are formed to provide optical alignment therebetween, with the laser diode disposed in a first opening, the lens element disposed in a second opening and the optical isolator disposed in a third opening of the dielectric layer.

16. The wafer scale arrangement of claim 15, wherein a single lens element is utilized with both transmitting and receiving optical signals, the single lens element comprising a lens array and disposed in an opening in the dielectric layer positioned to align with both the optical transmitting and receiving components.

17. The wafer scale arrangement of claim 1, wherein each transceiver module includes optical transmitting components including a laser diode, a lens element, an optical isolator and a submount component, the laser diode, lens element and optical isolator being attached to a surface of the submount component in an aligned configuration, the submount component being disposed within an opening formed through a predetermined area of the dielectric layer.

18. The wafer scale arrangement of claim 1, wherein each transceiver module includes optical receiving components including a lens element and a photodiode, and the dielectric layer is formed to including openings for the lens element and the photodiode in each region associated with a separate transceiver module, the openings being configured to provide optical alignment between an incoming optical signal, the photodiode and the lens element.

* * * * *